(12) United States Patent
Kamath et al.

(10) Patent No.: US 10,545,053 B2
(45) Date of Patent: Jan. 28, 2020

(54) DYNAMIC ELEMENT MATCHING IN AN INTEGRATED CIRCUIT

(71) Applicant: Xilinx, Inc., San Jose, CA (US)

(72) Inventors: Umanath R. Kamath, Citywest (IE); Padraig Kelly, Crosshaven (IE); John K. Jennings, Glenageary (IE)

(73) Assignee: XILINX, INC., San Jose, CA (US)

( * ) Notice: Subject to any disclaimer, the term of this patent is extended or adjusted under 35 U.S.C. 154(b) by 291 days.

(21) Appl. No.: 15/616,765

(22) Filed: Jun. 7, 2017

(65) Prior Publication Data

US 2018/0356294 A1 Dec. 13, 2018

(51) Int. Cl.
*G01K 7/00* (2006.01)
*G01K 7/01* (2006.01)
*H03K 19/003* (2006.01)
*H03K 19/0175* (2006.01)
*G01K 1/02* (2006.01)

(52) U.S. Cl.
CPC .............. *G01K 7/01* (2013.01); *G01K 1/026* (2013.01); *G01K 7/015* (2013.01); *H03K 19/00307* (2013.01); *H03K 19/017581* (2013.01)

(58) Field of Classification Search
USPC .................................................. 374/178, 166
See application file for complete search history.

(56) References Cited

U.S. PATENT DOCUMENTS 6,019,508 A * 2/2000 Lien ........................... G01K 7/01
327/512
8,182,141 B1 5/2012 Collins et al.
10,290,330 B1 * 5/2019 Kamath .................. G11C 7/04
2015/0276497 A1 10/2015 Miyazaki et al.
2018/0226929 A1 * 8/2018 Kamath ................ H03F 3/4508

FOREIGN PATENT DOCUMENTS

WO 2016137647 9/2016

OTHER PUBLICATIONS

Heidary Shalmany Saleh, et al.: "A 36-A Integrated Current-Sensing System with a 0.3% Gain Error and a 400- $\mu$ / text {A}$ Offset From -55 oC to +85 oC", IEEE Journal of Solid-State Circuits, IEEE Service Center, Piscataway, NJ, USA, vol. 52, No. 4, Apr. 1, 2017 (Apr. 1, 2017), pp. 1034-1043, XP011644060, ISSN: 0018-9200, DOI: 10.1109/JSSC.2016.2639535.

* cited by examiner

Primary Examiner — Mirellys Jagan
(74) Attorney, Agent, or Firm — Patterson + Sheridan, LLP

(57) ABSTRACT

An example dynamic element matching (DEM) circuit includes: a plurality of bipolar junction transistors (BJTs), each of the plurality of BJTs having a base terminal and a collector terminal coupled to electrical ground; a plurality of pairs of force switches, each pair of force switches coupled to an emitter of a respective one of the plurality of BJTs; a plurality of pairs of sense switches, where each pair of sense switches is coupled to the emitter of a respective one of the plurality of BJTs, a first switch in each pair of sense switches is coupled to a first node, and a second switch in each pair of sense switches is coupled to a second node; a first current source coupled to a first switch in each pair of force switches; and a second current source coupled to a second switch in each pair of force switches.

14 Claims, 7 Drawing Sheets

US 10,545,053 B2

DYNAMIC ELEMENT MATCHING IN AN INTEGRATED CIRCUIT

TECHNICAL FIELD

Examples of the present disclosure generally relate to electronic circuits and, in particular, to dynamic element matching for in an integrated circuit (IC).

BACKGROUND

Temperature sensing circuits are important functions associated with integrated circuits (ICs), such as large System-on-Chip (SoC), field programmable gate array (FPGA), and like devices. One type of temperature sensing circuit is implemented by driving a first diode-connected bipolar junction transistor (BJT) with a unit current and a second diode-connected BJT with a current that is some multiple of the unit current. The second diode-connected BJT is mated with the first diode-connected BJT. That is, a 1:1 BJT array is driven with a 1:N current bias, where N is a positive integer greater than one. Such a temperature sensing circuit consumes a large area at least in part due to the matching requirement of the 1:N current bias sources. Mismatches between the diode-connected BJTs lead to inaccurate temperature measurements.

SUMMARY

Techniques for dynamic element matching (DEM) in an integrated circuit (IC) are described. In an example, a DEM circuit includes: a plurality of bipolar junction transistors (BJTs), each of the plurality of BJTs having a base terminal and a collector terminal coupled to electrical ground; a plurality of pairs of force switches, each pair of force switches coupled to an emitter of a respective one of the plurality of BJTs; a plurality of pairs of sense switches, where each pair of sense switches is coupled to the emitter of a respective one of the plurality of BJTs, a first switch in each pair of sense switches is coupled to a first node, and a second switch in each pair of sense switches is coupled to a second node; a first current source coupled to a first switch in each pair of force switches; and a second current source coupled to a second switch in each pair of force switches.

In an example, an integrated circuit (IC) includes a system monitor circuit, and at least one DEM circuit coupled to the system monitor circuit. Each of the at least one DEM circuit includes: a plurality of bipolar junction transistors (BJTs), each of the plurality of BJTs having a base terminal and a collector terminal coupled to electrical ground; a plurality of pairs of force switches, each pair of force switches coupled to an emitter of a respective one of the plurality of BJTs; a plurality of pairs of sense switches, where each pair of sense switches is coupled to the emitter of a respective one of the plurality of BJTs, a first switch in each pair of sense switches is coupled to a first node, and a second switch in each pair of sense switches is coupled to a second node; a first current source coupled to a first switch in each pair of force switches; and a second current source coupled to a second switch in each pair of force switches.

In another example, a method of DEM in an integrated circuit (IC) includes: controlling force switches and sense switches coupled to emitters in an array of diode-connected bipolar junction transistors (BJTs) over a plurality of cycles, each cycle including: injecting a first current into a selected one of the diode-connected BJTs; injecting a second current into a circuit formed by remaining ones of the diode-connected BJTs; coupling the emitter of the selected one of the diode-connected BJTs to a first node; and coupling the emitter of the remaining ones of the diode-connected BJTs to a second node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
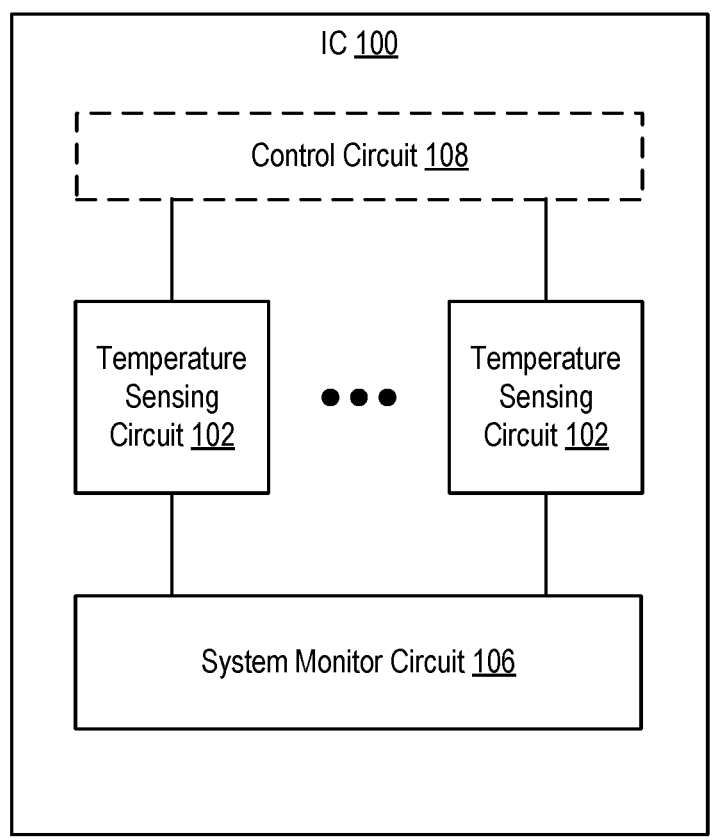
FIG. 1 is a block diagram depicting an integrated circuit (IC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for dynamic element matching in an integrated circuit (IC) are described. In an example, a dynamic element matching (DEM) circuit includes an array of bipolar junction transistors (BJTs) configured as diodes (e.g., diode-connected BJTs). The BJTs are arranged into a 1:N array in which two currents are injected. This operation generates two different base-emitter junction voltages, which provide a delta base-emitter voltage. The DEM circuit incorporates analog averaging at a higher DEM frequency to reduce mismatch among the BJTs, as well as to use subsequent analog-to-digital converter (ADC) filtering more effectively. In an example, the DEM circuit is used in a temperature sensing application, but those skilled in the art will appreciate that the DEM circuit can have other applications. In a temperature sensing application, the two currents can be nominally identical (e.g., I1:I2 having a ratio of 1:1). In other applications, the two currents can be in other ratios (e.g., I1:I2 can be 2:3, 3:2, or generally N:1 or 1:N). In various examples herein, the DEM circuit is described with reference to a temperature sensing application. It is to be understood that the DEM circuit can be used in other applications. These and other aspects are described below with respect to the drawings.

FIG. 1 is a block diagram depicting an integrated circuit (IC) 100 according to an example. The IC 100 includes at least one temperature sensing circuit 102 (generally referred to as at least one dynamic element matching (DEM) circuit) coupled to a system monitor circuit 106. Example implementations of the temperature sensing circuit 102 are described below. In general, each temperature sensing circuit 102 includes a 1:N array of diode-connected BJTs into which two nominally identical (or substantially similar) currents are injected (e.g., 1:1 current ratio). The temperature sensing circuit 102 generates two different base-emitter voltages, from which a delta base-emitter voltage is obtained. Each temperature sensing circuit 102 is configured to perform analog averaging at a higher dynamic element matching (DEM) frequency to the effects of mismatch among the BJTs. In an example, each temperature sensing circuit 102 incorporates current sources and switch control logic therein. Alternatively, the IC 100 can include a control circuit 108 that provides current sources and/or switch control logic for a plurality of the temperature sensing circuits 102. The system monitor circuit 106 receives delta base-emitter voltages from the temperature sensing circuits 102. The system monitor circuit 106 can convert the delta base-emitter voltages to digital values representing temperatures.

Figure 2:
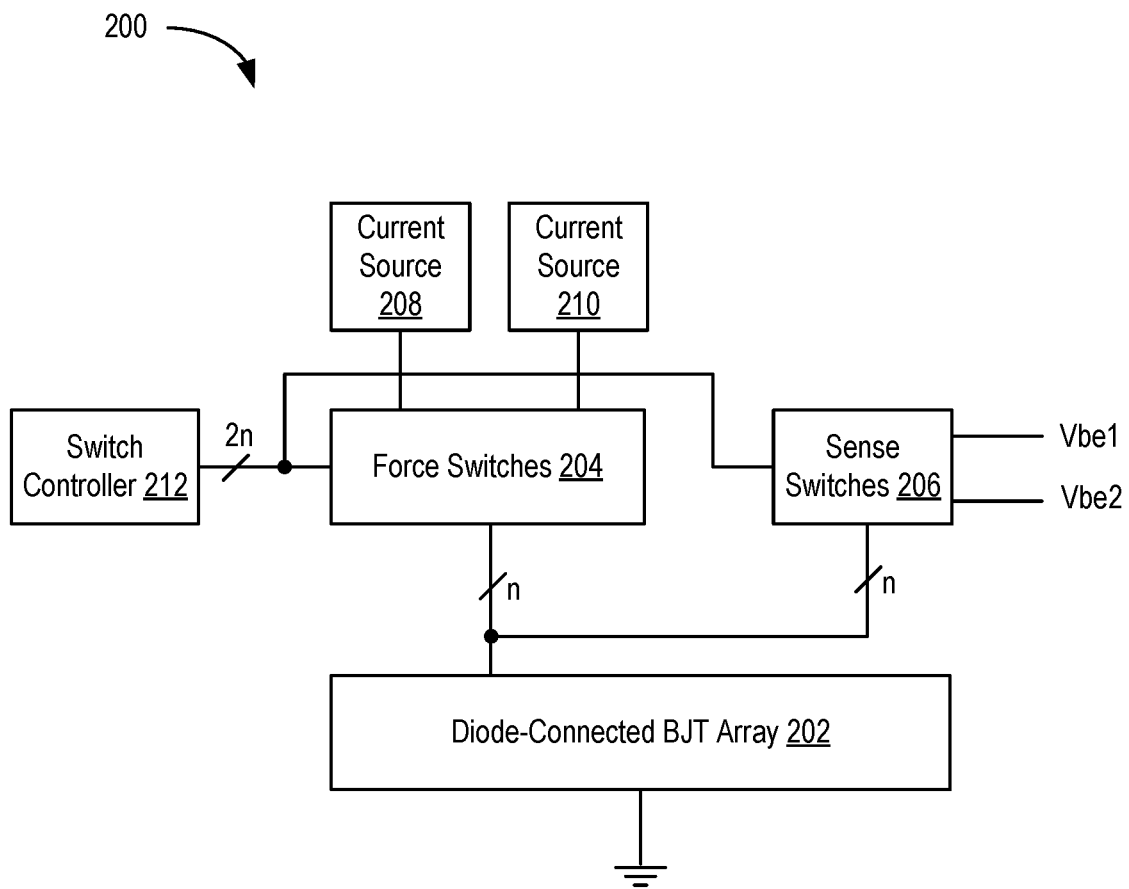
FIG. 2 is a block diagram depicting a temperature sensing circuit according to an example.

FIG. 2 is a block diagram depicting a dynamic element matching (DEM) circuit 200 according to an example. The DEM circuit 200 can be used as a temperature sensing circuit or can be used in other applications. The DEM circuit 200 includes a diode-connected BJT array 202, force switches 204, sense switches 206, current sources 208 and 210, and a switch controller 212. The force switches 204 are coupled between the current sources 208, 210 and the diode-connected BJT array. The diode-connected BJT array 202 includes n BJTs to implement a 1:N array (where N is an integer greater than one and n=N+1). Thus, the diode-connected BJT array 202 includes n emitter terminals. The force switches 204 are coupled to the n emitter terminals of the diode-connected BJT array 202. The base and collector terminals of the BJTs in the diode-connected BJT array 202 are coupled to electrical ground. The sense switches 206 are also coupled to the n emitter terminals of the diode-connected BJT array 202. The sense switches 206 output voltages Vbe1 and Vbe2.

In an example, the force switches 204 include n switches coupled between the current source 208 and the n emitter terminals of the diode-connected BJT array 202, and n switches coupled between the current source 210 and the n emitter terminals of the diode-connected BJT array 202. Thus, the force switches 204 include 2n switches. Likewise, the sense switches 206 include n switches coupled between the n emitter terminals of the diode-connected BJT array 202 and the terminal Vbe1, and n switches coupled the n emitter terminals of the diode-connected BJT array 202 and the terminal Vbe2. Thus, the sense switches 206 include 2n switches. The switch controller 212 includes 2n outputs coupled to the 2n switches in the force switches 204, respectively. Likewise, the 2n outputs of the switch controller 212 are coupled to the 2n switches in the sense switches 206, respectively.

In operation, each of the current sources 208 and 210 supply the same or substantially the same current. In a given cycle, the switch controller 212 controls the force switches 204 to inject current from the current source 208 into a selected one of the BJTs in the diode-connected BJT array 202. The switch controller 212 controls the force switches 204 to inject current from the current source 210 into the remaining N of the BJTs in the diode-connected BJT array 202. The switch controller 212 controls the sense switches 206 to couple the emitter of the selected one of the BJTs in the diode-connected BJT array 202 to the terminal Vbe1. The switch controller 212 controls the sense switches 206 to couple the emitters of the remaining N BJTs of the diode-connected BJT array 202 to the terminal Vbe2. Thus, the voltage at the terminal Vbe2 is the analog average of the emitter voltages of N BJTs driven by the current source 210. The voltage at the terminal Vbe1 is the emitter voltage of a selected one BJT driven by the current source 208. The switch controller 212 operates as described above for n cycles selecting each of the n BJTs of the diode-connected BJT array 202 to receive current from the current source 208. The switch controller 212 can repeat operation for a plurality of sets of n cycles over time.

Figure 3:
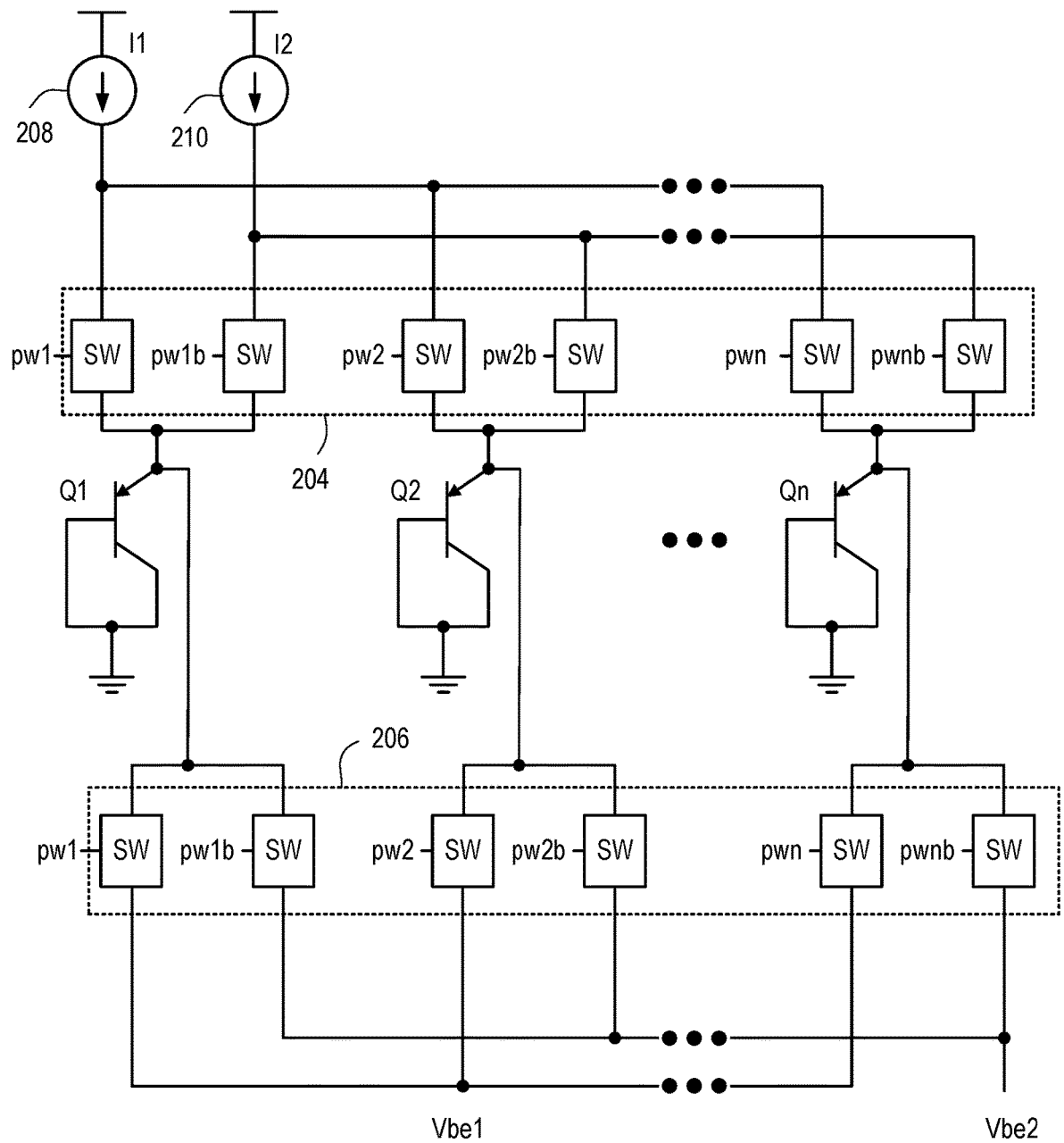
FIG. 3 is a schematic diagram depicting a portion of the temperature sensing circuit of FIG. 2 according to an example.

FIG. 3 is a schematic diagram depicting a portion 300 of the DEM circuit 200 according to an example. In the example, the diode-connected BJT array 202 includes n transistors Q1 . . . Qn, where each transistor is a PNP-type BJT. The base and collector terminals of each of the transistors Q1 . . . Qn are coupled to electrical ground. The emitter terminal of each transistor Q1 . . . Qn is coupled to a pair of switches SW in the force switches 204, as well as a pair of switches SW in the sense switches 206. For a given transistor Qx (x between 1 and n), a first force switch is coupled to the current source 208, a second force switch is coupled to the current source 210, a first sense switch is coupled to the terminal Vbe1, and a second sense switch is coupled to the terminal Vbe2. For a given transistor Qx (x between 1 and n), the first force switch is controlled by a signal pwx and the second force switch is controlled by a signal pwxb, were the signal pwxb is the logical complement of the signal pwx. Likewise, for a given transistor Qx (x between 1 and n), the first sense switch is controlled by the signal pwx and the second sense switch is controlled by the signal pwxb. In the example, the switch controller 212 outputs signals pw1 . . . pwn and signals pw1b . . . pwnb.

Figure 4:
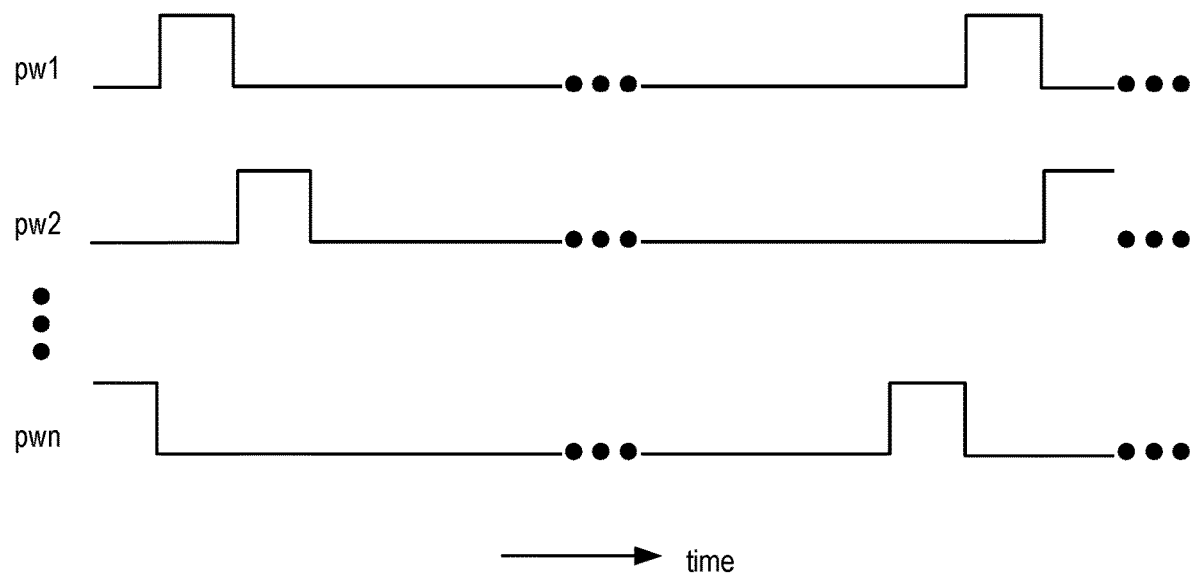
FIG. 4 is a timing diagram showing switch control signals according to an example.

FIG. 4 is a timing diagram showing the switch control signals according to an example. For purposes of clarity by example, FIG. 4 shows only the true logic signals pw1 . . . pwn. Those skilled in the art will appreciate that the complement logic signals pw1b . . . pwnb are logical complements of the signals pw1 . . . pwn shown in FIG. 4. As shown in FIG. 4, the logic signals pw1 . . . pwn form a set of sequential clock signals. The logic signal pw1 includes a pulse, followed by the logic signal pw2, followed by the logic signal pw3, and so on. For a given logic signal, the time interval between successive pulses is at least as long as N*PW, where PW is the pulse width.

As discussed above, BJTs are used in temperature sensing applications. BJTs are parasitic devices in complementary metal oxide semiconductor (CMOS) processes. The performance of BJTs manufactured using a CMOS process is degraded as the CMOS process scales (which is driven by the digital logic of the IC). In the examples above, two different base-emitter voltages Vbe1 and Vbe2 are generated, which can be expressed as:

$$Vbe1 = \eta(kT/q)\ln(Ic1/Is)$$

$$Vbe2 = \eta(kT/q)\ln(Ic2/Is)$$

where η is the ideality factor, the quantity kT/q is the thermal voltage, Is the saturation current, Ic1 is the collector current of a first BJT, and Ic2 is the collector current of a second BJT. The thermal voltage is the product of Boltzmann's constant (k) and the temperature T divided by the magnitude of electron charge (q). In such case, the delta base-emitter voltage can be expressed as:

$$\Delta Vbe1 = \eta(kT/q)\ln(Ic2/Ic1)$$

Ideally, given a constant ratio of Ic2:Ic1 and a constant ideality factor, the delta base-emitter voltage changes proportionally with changes in temperature. In practical applications, the ideality factor is not constant and changes with both current density and temperature.

Dynamic element matching (DEM) is used to reduce mismatch between BJTs formed using a CMOS process. In the examples above, the switch controller 212 implements DEM by controlling the force switches 204 and the sense switches 206. In each cycle, one BJT is driven by the current source 208 while each other BJT is driven by the current source 210. Mismatch between the BJTs is upconverted to a tone that is Fdem/n, where Fdem is the frequency of rotation. Higher tone frequency results in better performance of the temperature sensing circuit.

Consider a diode-connected BJT array having eight BJTs to implement a 1:7 BJT array. In one temperature sensing scheme (digital sensing scheme), the base-emitter voltage of each BJT is measured during each cycle and converted to digital values. For each cycle, the digital values of the base-emitter voltages of the N BJTs are averaged to obtain Vbe2. The digital value of the base-emitter voltage of the selected BJT is used as Vbe1. With practical sense switches (having a switch-on resistance), and with layout path resistance mismatch, more than eight rotation cycles are required in a digital sensing scheme. For example, in the digital sensing scheme discussed above, there 8*7=56 cycles per sensing period. Thus, the mismatch tone appears at Fdem/56.

Figure 5:
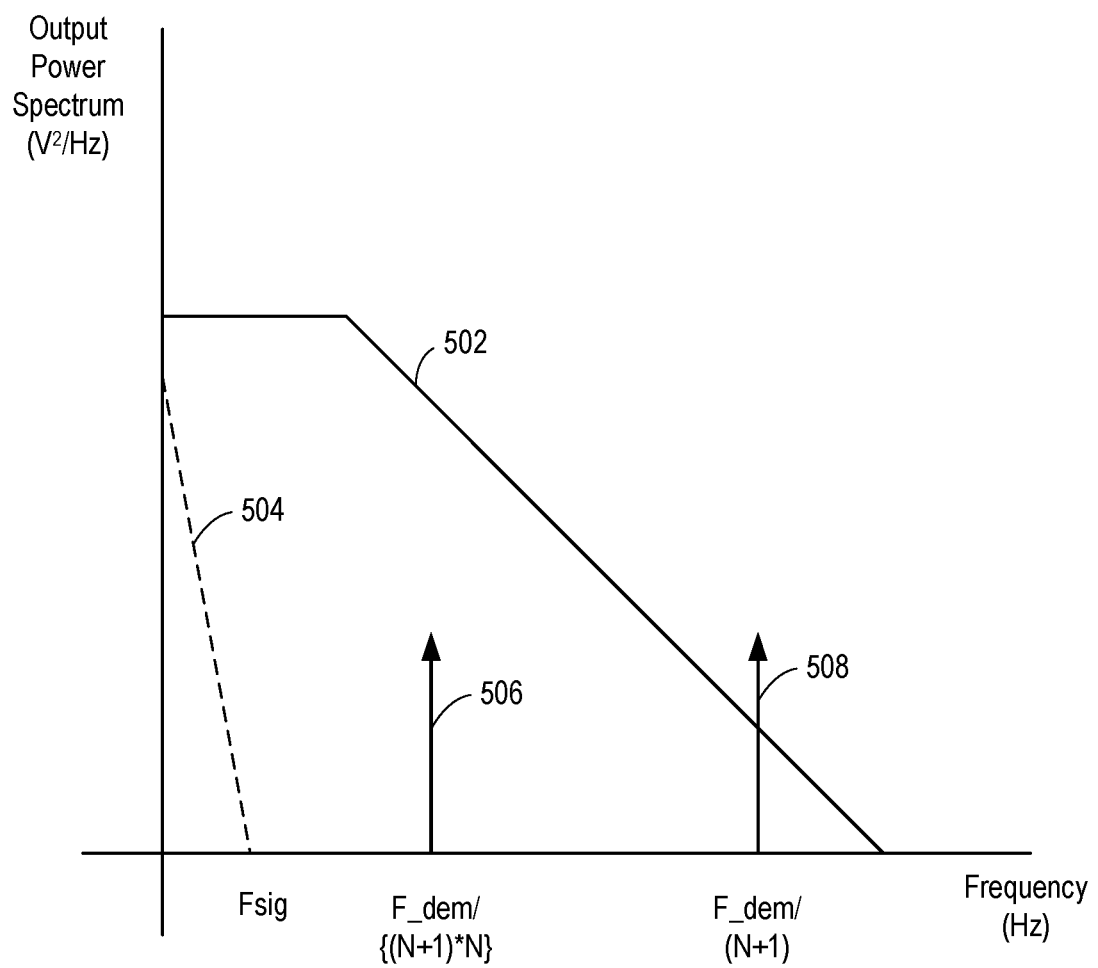
FIG. 5 is a graph illustrating the output spectrum of a temperature sensing circuit according to an example.

FIG. 5 is a graph illustrating the output spectrum of a temperature sensing circuit according to an example. In FIG. 5, the Y-axis represents output spectrum power and the X-axis represents frequency. An output signal spectrum 504 is between 0 Hz and Fsig Hz. FIG. 5 also shows a transfer function 502 of a low-pass filter in the system monitor circuit 106. In the digital sensing scheme discussed above, a tone 506 appears at frequency Fdem/{(N+1)*N} (e.g., Fdem/56). The example implementations of the temperature sensing circuit 102 described above employ analog averaging as opposed to digital averaging. In the described scheme, only 8 cycles are required per sensing period (assuming n=8). Thus, the mismatch tone appears at Fdem/8, which is higher than in the digital averaging scheme. In the inventive analog sensing scheme, a tone 508 appears at frequency Fdem/(N+1). As such, a low pass filter in the system monitor circuit 106 can better attenuate the mismatch tone when using the temperature sensing circuit 102 described herein. Although the techniques described herein are described as being applied to temperature sensing, it is to be understood that the techniques can be applied to other types of DEM involving active or passive elements.

Figure 6:
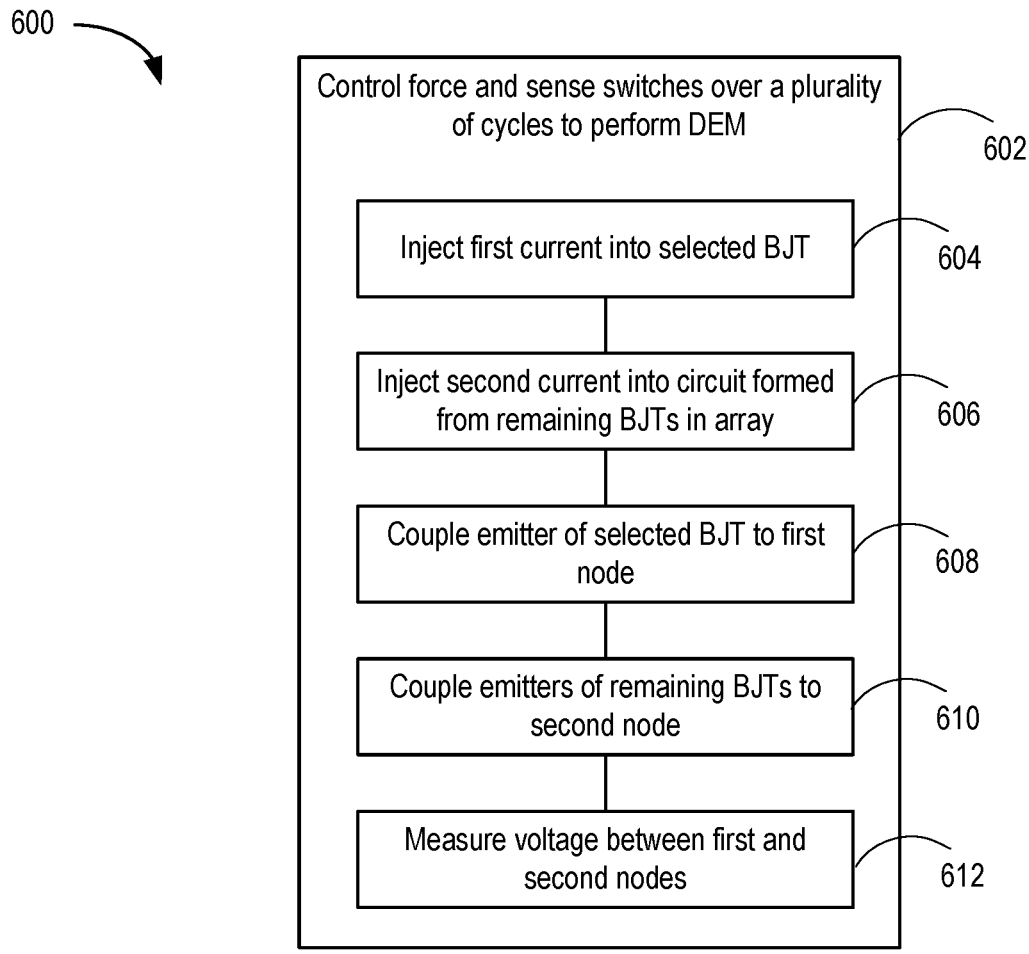
FIG. 6 is a flow diagram depicting a method of DEM in an IC according to an example.

FIG. 6 is a flow diagram depicting a method 600 of DEM in an IC according to an example. The method 600 includes a block 602, where the switch controller 212 controls the force switches 204 and the sense switches 206 over a plurality of cycles to perform DEM As shown in FIG. 3, the force switches 204 and the sense switches 206 are coupled to emitters of transistors in the diode-connected BJT array 202. Each cycle performed in step 602 includes the following sub-blocks. Note that the sub-blocks of block 602 do not necessarily occur in sequence and that some or all of the blocks can be performed concurrently. Block 602 can be repeating for a plurality of DEM sensing cycles (e.g., temperature sensing cycles).

At block 604, the current source 208 injects a first current into a selected one of the diode-connected BJTs 202. At block 606, the second current source 210 injects a second current into a circuit formed by the remaining diode-connected BJTs 202 (i.e., those other than the ones coupled to the current source 208). Blocks 604 and 606 are performed by the switch controller 212 selectively controlling the force switches 204. At block 608, the emitter of the selected BJT 202 is coupled to a first node. At block 610, the emitter of the remaining BJTs (other than the selected BJT) is coupled to a second node. Blocks 608 and 610 are performed by the switch controller 212 selectively controlling the sense switches 206. Blocks 604-610 can be repeated for each of the plurality of cycles, where a different BJT in the BJT array 202 is selected for each consecutive cycle. The block 602 can include a further block 612, where a circuit (e.g., the system monitor 106) measures voltage of the first node with respect to the second node.

Figure 7:
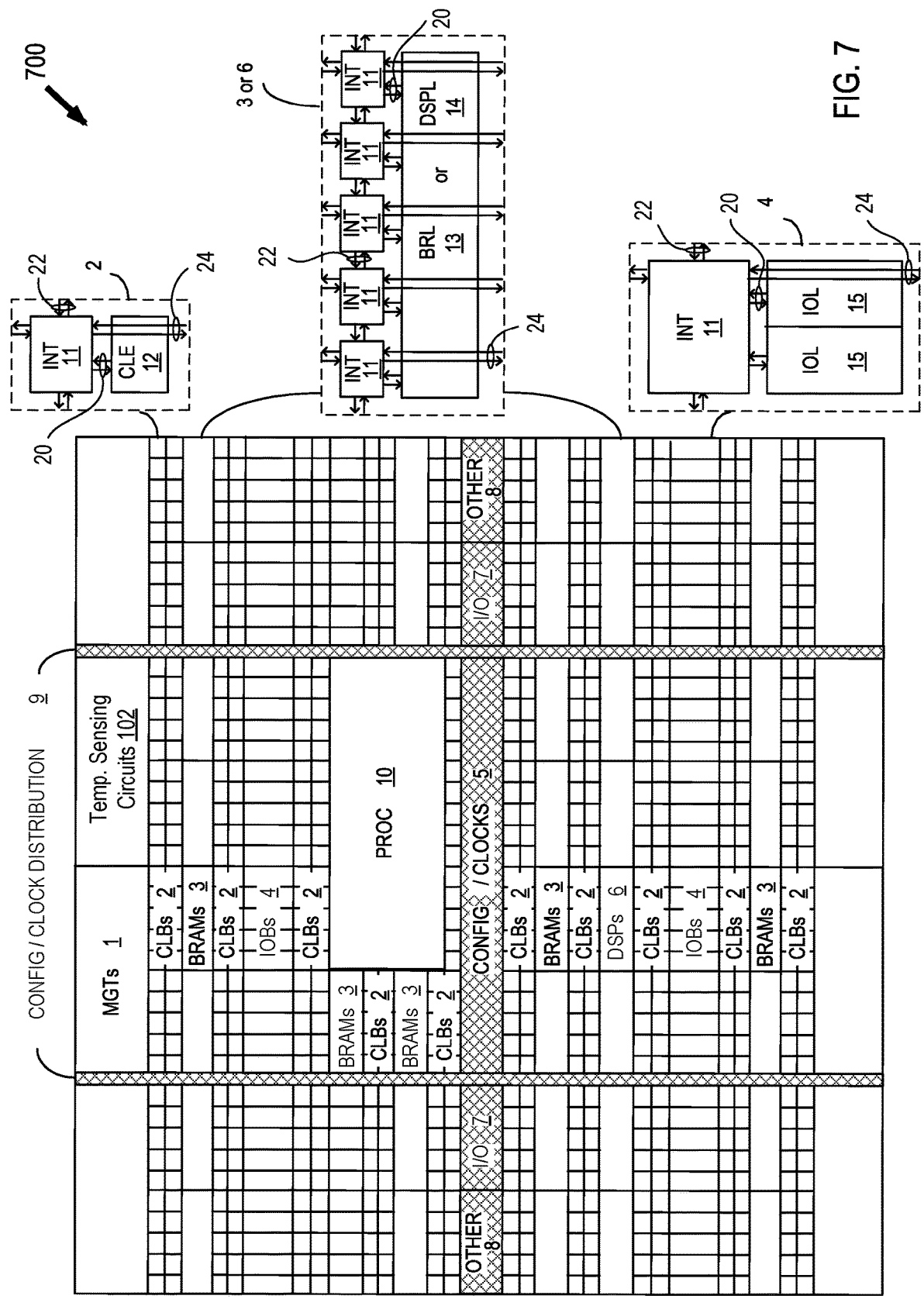
FIG. 7 is a block diagram depicting an example field programmable gate array (FPGA) in which the temperature sensing circuit described herein can be employed.

The temperature sensing circuit 102 (or DEM circuit 200) described above can be implemented within an integrated circuit, such as a field programmable gate array (FPGA) or like type programmable circuit. FIG. 7 illustrates an architecture of FPGA 700 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 700 can include one or more instances of the temperature sensing circuit 102 described above.

In some FPGAs, each programmable tile can include at least one programmable interconnect element ("INT") 11 having connections to input and output terminals 20 of a programmable logic element within the same tile, as shown by examples included at the top of FIG. 7. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 7) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A dynamic element matching (DEM) circuit, comprising:
   a plurality of bipolar junction transistors (BJTs), each of the plurality of BJTs having a base terminal and a collector terminal coupled to electrical ground;
   a plurality of pairs of force switches, each pair of force switches coupled to an emitter of a respective one of the plurality of BJTs;
   a plurality of pairs of sense switches, where each pair of sense switches is coupled to the emitter of a respective one of the plurality of BJTs, a first switch in each pair of sense switches is coupled to a first node, and a second switch in each pair of sense switches is coupled to a second node;
   a first current source coupled to a first switch in each pair of force switches; and
   a second current source coupled to a second switch in each pair of force switches.

2. The DEM circuit of claim 1, wherein a first current supplied by the first current source and a second current supplied by the second current source is substantially the same.

3. The DEM circuit of claim 1, wherein a first current supplied by the first current source is greater than a second current supplied by the second current source or the second current is greater than the first current.

4. The DEM circuit of claim 1, further comprising:
   a switch controller coupled to the plurality of pairs of force switches and the plurality of pairs of sense switches.

5. The DEM circuit of claim 4, wherein the switch controller is configured to generate a plurality of differential logic signal pairs, where each pair of sense switches and each pair of force switches receives a respective one of the plurality of differential logic signal pairs.

6. The DEM circuit of claim 5, wherein the first switch in each pair of the force switches receives a true logic signal of a respective differential logic signal pair and the second switch in each pair of the force switches receives a complement logic signal of the respective differential logic signal pair.

7. The DEM circuit of claim 6, wherein the first switch in each pair of the sense switches receives the true logic signal of the respective differential logic signal pair and the second switch in each pair of the sense switches receives the complement logic signal of the respective differential logic signal pair.

8. An integrated circuit (IC), comprising:
   a system monitor circuit; and
   at least one dynamic element matching (DEM) circuit coupled to the system monitor circuit, each of the at least one DEM circuit comprising:
   a plurality of bipolar junction transistors (BJTs), each of the plurality of BJTs having a base terminal and a collector terminal coupled to electrical ground;
   a plurality of pairs of force switches, each pair of force switches coupled to an emitter of a respective one of the plurality of BJTs;
   a plurality of pairs of sense switches, where each pair of sense switches is coupled to the emitter of a respective one of the plurality of BJTs, a first switch in each pair of sense switches is coupled to a first node, and a second switch in each pair of sense switches is coupled to a second node;
   a first current source coupled to a first switch in each pair of force switches; and
   a second current source coupled to a second switch in each pair of force switches.

9. The IC of claim 8, wherein a first current supplied by the first current source and a second current supplied by the second current source is substantially the same.

10. The IC of claim 8, wherein each of the at least one DEM circuit is a temperature sensing circuit.

11. The IC of claim 8, further comprising:
    a switch controller coupled to the plurality of pairs of force switches and the plurality of pairs of sense switches.

12. The IC of claim 11, wherein the switch controller is configured to generate a plurality of differential logic signal pairs, where each pair of sense switches and each pair of force switches receives a respective one of the plurality of differential logic signal pairs.

13. The IC of claim 12, wherein the first switch in each pair of the force switches receives a true logic signal of a respective differential logic signal pair and the second switch in each pair of the force switches receives a complement logic signal of the respective differential logic signal pair.

14. The IC of claim 13, wherein the first switch in each pair of the sense switches receives the true logic signal of the respective differential logic signal pair and the second switch in each pair of the sense switches receives the complement logic signal of the respective differential logic signal pair.

* * * * *